United States Patent [19]
Asatourian

[11] Patent Number: 5,610,389
[45] Date of Patent: Mar. 11, 1997

[54] STABILIZED HYBRID FOCAL PLANE ARRAY STRUCTURE

[75] Inventor: Rolin K. Asatourian, Fullerton, Calif.

[73] Assignee: Rockwell International Corporation, Seal Beach, Calif.

[21] Appl. No.: 409,229

[22] Filed: Mar. 23, 1995

[51] Int. Cl.$^6$ ............................................. H01J 3/14
[52] U.S. Cl. ..................... 250/216; 250/370.08; 257/186
[58] Field of Search .................................. 250/216, 208.1, 250/208.2, 214.1, 332, 352, 370.08; 257/186, 469, 468, 470; 437/3.5, 247, 248

[56] References Cited

U.S. PATENT DOCUMENTS

| | | | |
|---|---|---|---|
| 4,943,491 | 7/1990 | Norton et al. | 250/370.08 |
| 5,308,980 | 5/1994 | Barton | 250/332 |
| 5,365,088 | 11/1994 | Myrosznyk | 257/186 |
| 5,382,797 | 1/1995 | Kunimoto et al. | 250/352 |

OTHER PUBLICATIONS

K. Zouari and Y. C. Lee, "Stress Analysis of the Vertical Interconnect for Three–Dimensional Packaging", Journal Of Electrical Packaging, Sep. 1991, vol. 113, pp. 233–239.

Tsung–Yu Pan and Yi–Hsin, Pao, "Stress Analysis of Multilayer Stacked Asemblies", Presented At The Winter Annual Meeting San Francisco, California–Dec. 10–15, 1989, pp. 1–5.

Yi–Hsin Pao and Ellen Eisele, "Interfacial Shear and Peel Stresses in Multilayered Thin Stacks Subjected to Uniform Thermal Loading", Transactions Of The ASME, Jun. 1991, pp. 164–172.

An–Yu Kuo and Kuan–Luen Chen, "Effects of Thickness on Thermal Stresses in a Thin Solder or Adhesive Layer", Presented At The Winter Annual Meeting Dec. 1–6, 1991 Atlanta, GA, pp. 1–6.

E. Subir, "Technical Briefs", Predicted Residual Bow of Thin Plastic Packages of Integrated Circuit Devices, Journal Of Electronic Packaging, Dec. 1992, pp. 467–470.

V. I. Lavrenyuk and V. A. Nakura, "Thermal Stresses In A Multilayer Semiconductor Structure", Jan. 1984, Flemm Publishing Corporation, pp. 2–8.

Primary Examiner—Que T. Le
Attorney, Agent, or Firm—George A. Montanye; David J. Arthur; Susie H. Oh

[57] ABSTRACT

A hybrid focal plane array (FPA) structure including a soft, localized, and thick epoxy for supporting the FPA on a cooling device. The hybrid FPA arrangement includes a crystalline optical substrate with a layer of an optically sensitive material disposed on one surface of the substrate. The optically sensitive side of the substrate layer is coupled to a MUX chip via an interconnection scheme. The layered configuration of the detector, the optically-sensitive material, interconnection network, and the MUX is mounted to a platform or dewar cold plate with a pliable, thick epoxy which is locally deposited onto the platform to effectively form a raised mounting cushion which supports the MUX and reduces deleterious effects resulting form a close coupling of the FPA to the mounting platform.

24 Claims, 2 Drawing Sheets

STABILIZED HYBRID FOCAL PLANE ARRAY STRUCTURE

BACKGROUND OF THE INVENTION

1. Field of the Invention

The present invention relates to stabilizing and supporting a focal plane array (FPA) on a cooling platform. More particularly, the present invention provides for enhanced reliability of the FPA throughout thermal cycling processes during which temperature-induced contraction and expansion between dissimilar materials comprising the FPA may significantly vary.

2. Description of Related Art

A further discussion of FPA mounting and stiffening techniques is described in copending application entitled "Hybrid Focal Plane Array Stabilizing Apparatus And Method," Serial No. 08/409,230, filed Mar. 23, 1995, and invented by R. K. Asatourian, D. E. Cooper, W. L. Morris, and M. R. James. The disclosure of the aforementioned copending application is incorporated herein by reference.

Hybrid FPAs, by definition, are formed of a variety of different materials having differing coefficients of thermal expansion. Accordingly, the conventional layering scheme of such FPAs often causes the materials incorporated in the FPA to be distorted and deflected as the result of the potentially wide changes in temperatures applied to the FPA.

As illustrated in FIG. 1, FPAs typically include several different layers of materials, such as an optical substrate layer 100 coated with an optically-sensitive material 102, an interconnecting scheme typically formed of pliable conducting bumps 104, and an electronic means 106, such as a multiplexer (MUX) layer which includes the FPA electronics. The above-described materials of the FPA are mounted on a platform or base 110 in a layered arrangement over a full-face epoxy layer 108. The system is cooled by cooling the mounting platform which, in turn, cools the FPA. Infrared radiation enters the optical substrate layer and is detected by the layer of optically-sensitive material.

However, like any system of dissimilar materials exposed to thermal excursions, the FPA and its mounting configuration must meet predetermined thermal cycling reliability objectives of a particular application. If temperature variations are sufficiently great and the thermal expansion coefficients (TECs) of the materials used in the FPA are substantially different, damage to the interconnection scheme between each of the layers of the FPA and the optically sensitive material can occur after a number of cycles.

For example, the hybrid interface of the FPA, e.g., the interconnecting bumps between the detector layer and the MUX, is pliable and thermal contraction can damage these interconnections which form the electrical and mechanical contacts for each pixel of the FPA. Large strains on the interconnect bumps may break the connections, opening the electrical contact between the two layers. Stresses in this region can also lead to damage of the optically sensitive detector layer, reducing its photo-response and increasing the noise.

More particularly, with regard to lateral, or in-plane, deformations of the interconnect bumps, it has been found that such deformations are typically caused by the difference in the contraction rate of the hybrid FPA components. In addition to in-plane deformation, such contraction rate differences can induce out-of-plane forces on the FPA leading to bowing of the FPA. For example, in a typical hybrid FPA in which the detector material has a TEC higher than the MUX, the hybrid FPA will assume a concave deflection or bow when cooled.

Furthermore, this undesirable bowing may be affected by the mounting of the hybrid FPA on a supporting platform, such as the cold plate of a dewar. The deformations experienced by the mounting platform may then be transmitted to the FPA, and may increase or decrease the FPA bow depending on the direction of deflection of the platform. More particularly, the distortions and deflections experienced by the FPA may potentially be further increased by deflections and distortions that the platform itself experiences when it is cooled down. Thus, due to the mismatch of TECs of various layers in the FPA and the platform, as well as the deflections of the platform itself, the interconnect bumps may experience both an in-plane and an out-of-plane deformation leading to their work-hardening, and eventual fracture or separation.

One approach used to reduce damage to the interconnect bumps has been to back-fill the space between the MUX and the detector with epoxy. This epoxy takes some of the mechanical load off the bumps, and helps to hold the MUX and the detector layers together, thereby reducing bump damage. However, the back-fill epoxy, which generally has a TEC that is higher than both the MUX and the optical substrate forming the detector, also has a tendency to produce lateral tension on the bumps. Since the epoxy adheres to the surface of the optically sensitive material, it tends to strain the layer and degrade its characteristics.

In another approach, the MUX is forced to comply with the TEC of the detector optical substrate by mounting a thin MUX on a rigid material which has a TEC which matches that of the detector substrate. Although this approach tends to be less stressful on the optically sensitive material, certain practical challenges are introduced when the MUX circuitry and interconnect bumps are processed on a thin layer, or when the MUX layer is thinned after the electronic circuitry and bumps have been fabricated. In addition, functionality problems have been observed in thin MUXs where the electronic circuitry is subjected to extremely high stress levels both from the thinning process and from the compressive force during cooling. Neither of these approaches are immune to the impact of platform deflections.

SUMMARY OF THE INVENTION

Accordingly, it is an object of the present invention to improve the reliability, of a FPA by configuring the FPA mounting arrangement to substantially reduce and limit the amount of distortion and deflection of the materials used in the FPA. In particular embodiments, the present invention is directed to minimizing in-plane and out-of-plane forces on the bumps and the detector of a hybrid FPA.

These and other objectives are accomplished, according to an embodiment of the present invention, by a hybrid FPA arrangement in which temperature excursions do not affect or degrade the performance of the FPA which includes several layers of different materials having different TECs. The hybrid FPA includes an optical substrate with a layer of an optically sensitive material grown on one surface of the substrate. The optically sensitive side of the substrate layer is electrically and mechanically coupled to a MUX chip using interconnection bumps.

The MUX may be combined with other materials, and is constructed to balance the contraction of the optical substrate when cooled. The thickness of the MUX structure is determined such that the MUX structure exhibits an effective TEC which substantially matches that of the optical substrate. To prevent disruption of the symmetrical balance, as well as the TEC match between the MUX structure and the optical substrate, the MUX structure is mechanically isolated from the platform upon which it is mounted to the extent allowed by the cool down requirements of the particular application. Accordingly, the BCS is mounted onto a platform or dewar cold plate with a pliable, thick epoxy which is limited in area to control and reduce the mechanical coupling to the platform.

DETAILED DESCRIPTION OF THE PREFERRED EMBODIMENTS

The following description is of the best presently contemplated mode of carrying out the invention. In the accompanying drawings, like numerals designate like parts in the several figures. This description is made for the purpose of illustrating the general principles of the invention and should not be taken in a limiting sense. The scope of the innovation is best determined by reference to the accompanying claims.

Figure 1:
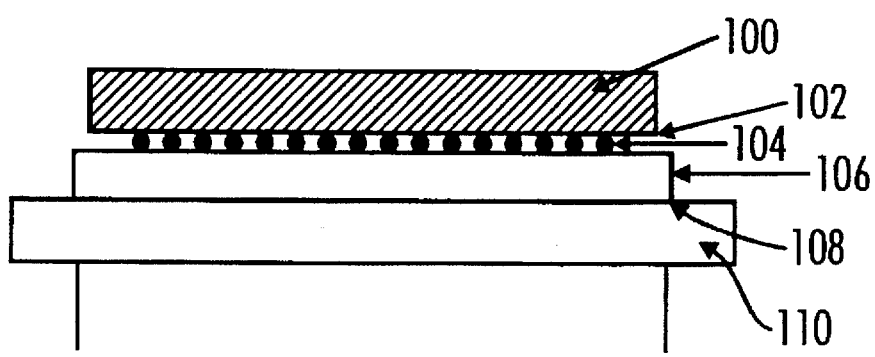
FIG. 1 is a cross-sectional view of a conventional focal plane array.
Figure 2:
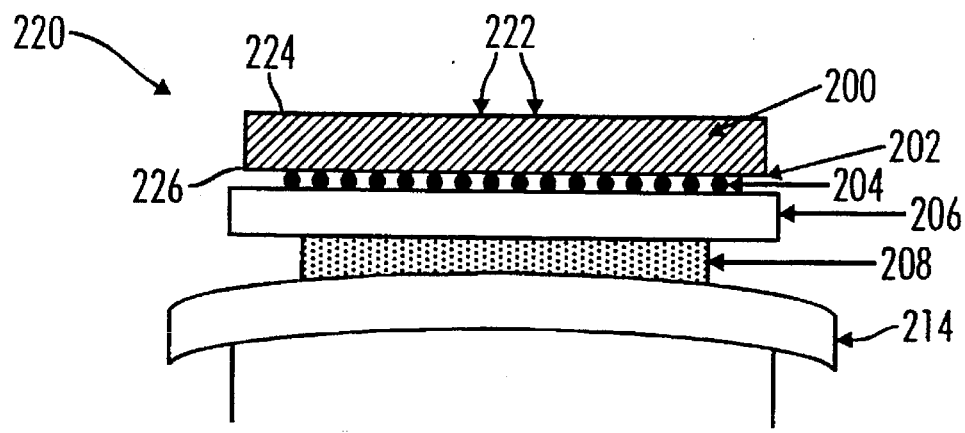
FIG. 2 is a cross-sectional view of a hybrid focal plane array in accordance with a preferred embodiment of the present invention.

A cross-section of a hybrid FPA in accordance with a preferred embodiment of the present invention is indicated in FIG. 2 as reference numeral 220. In the illustrated FPA, light 222 represented as infrared radiation impinges on the surface 224 of an optical substrate 200. The optical substrate is preferably formed of sapphire, or other substances of appropriate transmittance at desired wavelengths. Such wavelengths may cover a certain desired range of the infrared spectrum. For example, in preferred embodiments, the sapphire optical substrate 200 is approximately 0.013 inch thick. The size of the detector optical substrate 200 may vary depending upon the number of pixels in the array, e.g., 128×128 and 1024×1024.

The lower surface 226 of the detector 200 is coated with a thin layer of an optically sensitive material 202. The optically sensitive material 202 is provided to convert photons into electric charge. This electric charge is conducted through an interconnection scheme 204 to a multiplexer (MUXJ) chip 206. According to preferred embodiments of the present invention, the interconnection scheme 204 is formed by a pair of interconnect "bumps" per pixel. Each interconnect bump is made of a soft, pliable conducting material such as indium (In). One of the bumps in each pair is grown on the detector 200/202, and the other is coupled to the MUX 206 at each pixel location. The shape, size and pitch of the bumps may vary depending on the particular application. The MUX 206 and the detector 200 are then mated together in the process of the hybrid FPA fabrication such that each bump on the detector side is aligned with and squashed against the corresponding bump on the MUX side, establishing mechanical as well as an electrical connection.

In addition, as described in copending application Ser. No. 08/409,230, incorporated herein by reference, embodiments of the invention may include a multiple-layer substrate, which may include a rigid core material or balancing layer (see FIG. 2 of the copending application). The hybrid FPA is thus stabilized and protected from undesirable distorting effects of thermocycling by binding the surface of the MUX opposite the surface facing the interconnect bumps, the detector substrate, and the optically sensitive material to the rigid core material, which also may be bonded onto the balancing layer.

Preferably, the optically sensitive material 202 comprises a Mercury-Cadmium-Telluride (HgCdTe) compound on a buffering Cadmium-Telluride (CdTe) compound which are grown on the lower surface 226 of the detector optical substrate 200. The photons detected by the HgCdTe layer are converted into electrical charge and transferred through the In bumps to the MUX 206. The MUX is preferably formed of a silicon (Si) substrate or other semiconducting material, such as gallium arsenide (GaAs), appropriate for fabricating integrated circuits. The MUX 206 contains integrated circuits necessary to convert the electrical charge generated from the incoming photons at each pixel location to an appropriate electrical signal, and to clock out the signals from various pixels in an organized scheme. It will be recognized, however, that the materials and configuration of the MUX substrate, the number of output channels, the signal characteristics, the clocking scheme and its speed will vary depending upon the particular application.

In operation, the FPA 220 is cooled down to cryogenic temperatures every time it is used by coupling the detector 200, bumps 204, and MUX 206 layers to a cold source 214, such as a cryostat-cooled ceramic cold plate or dewar. Consequently, when the cold source 214 remains in contact with the FPA layers, the FPA can be cooled down. During its lifetime, the FPA is exposed to a number of thermal cycles between ambient and cryogenic temperatures. The number of cycles depends on the particular application. In some applications it is desirable that the FPA be able to survive thousands of thermal cycles with little degradation. Therefore, the FPA must be constructed to maintain its mechanical integrity and electrical functionality as it is cooled down repeatedly. However, it is recognized that the larger the hybrid FPA, the higher the stresses caused by the mismatch of TECs of various layers, especially at the edges and corners of the structure, as illustrated in FIG. 2. Thus, it has been found that the practical size of a hybrid FPA is limited by reliability problems relating to the mismatch of TECs of various layers.

However, in addition to being able to withstand thermal stresses generated by TEC mismatch of layers within its structure, the FPA 220 must survive stresses and other distorting effects generated by the mounting platform 214 or cold plate which are transmitted through the bonding material which is used to mount the FPA onto the platform 214. The mounting platform 214 itself may experience deflections and distortions when cooled down due to its construction, its own supporting material, and the manner in which it is attached to its supporting structure (not shown). For example, the supporting material could be a cold well which houses a cooling device, such as a cryostat, or a well for filling liquid cryogen.

Mechanical coupling to the mounting platform 2 14 may, in some instances, be beneficial for hybrid FPA reliability. An intimate coupling of the MUX 206 with a non-compliant epoxy to the platform 214 may be used to cause the MUX material to exhibit a TEC close to that of the optical substrate 202 if the TEC of the platform material is similar to that of the optical substrate 202 and, furthermore, if the platform itself does not exhibit excessive deflections when cooled.

However, if the materials used in the construction of the FPA and the platform are such that this benefit is not realized, a close mechanical coupling may have a harmful impact on the FPA reliability.

Consequently, in preferred embodiments of the invention, a reduced mechanical coupling to the platform 214 is implemented where the TECs of the MUX structure 206 and the optical substrate 202 are closely matched, or when the hybrid FPA is stabilized using a carrier of single or multiple layers, such that the MUX exhibits a TEC similar to that of the optical substrate. In both instances, a close coupling to the mounting platform may potentially disrupt this stability, yet the hybrid FPA can remain substantially stable.

Thus, it is often desirable to utilize a particular bonding configuration of the FPA 220 to the platform 214 that provides some degree of mechanical isolation. In a preferred embodiment of this invention, the bonding to the platform 214 is accomplished by applying a pliable, thick bonding material 208 to a limited area. The type of bonding epoxy used, its thickness, and its area are selected to minimize distortion and deflection of the FPA, yet also to provide sufficient thermal conduction, and adequate shock and vibration survivability to satisfy specific requirements of each particular application. For example, it has been observed that proper isolation can be achieved by using a Sylgard epoxy, approximately 6 mm in diameter and 180 microns in height. It will be recognized, however, that the materials used, as well as the dimensions of such materials, may vary depending on the type of epoxy, adhesive, or attachment device used to mount the hybrid FPA to a platform.

Figure 3:
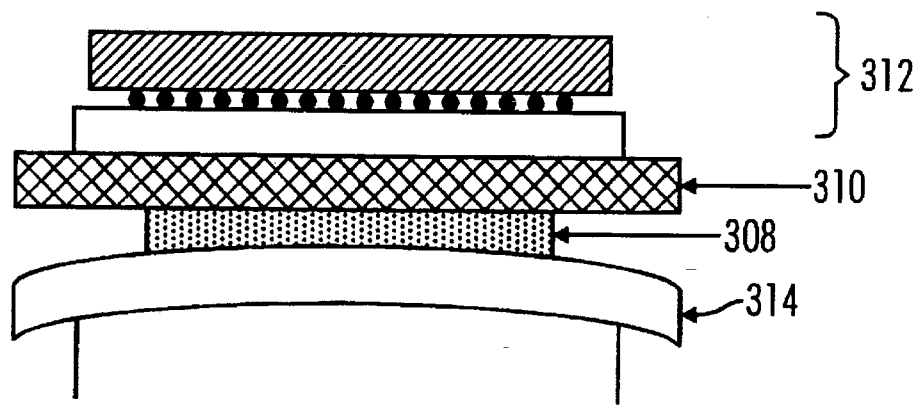
FIG. 3 is a cross-sectional view of a hybrid focal plane array in accordance with an alternate embodiment of the present invention.

Referring to FIG. 3, the hybrid FPA structure 312 is mounted on a carder 310 which is coupled to the platform 314. The carrier 310 may be implemented for purposes of geometry or handling. Preferably, the carrier 310 is mounted between the MUX (206 in FIG. 2) and the platform 314 using a soft, thick, localized epoxy 308. The material of the career 310 is preferably selected to provide adequate thermal conductance to allow conduction of heat into the cold plate 314 at an appropriate rate. It will be recognized that a variety of adhesives may be used to bind the various layers of the FPA together. Adhesives and other coupling means may be selected to satisfy the TEC, modulus, thermal conductance, out-gassing, curing and other mechanical, thermal, chemical, and economic aspects desired in a particular design.

Accordingly, embodiments of the present invention substantially reduce lateral and normal strain on the interconnect bumps and the detector by effectively forcing the TEC of the MUX to match that of the optical substrate without inducing an undesirable bending. The reliability of the hybrid FPA is thus greatly increased.

This detailed description is set forth only for purposes of illustrating examples of the present invention and should not be considered to limit the scope thereof in any way. Clearly numerous additions, substitutions, and other modifications can be made to the invention without departing from the scope of the invention which is defined in the appended claims and equivalents thereof.

What is claimed is:

1. A hybrid focal plane array structure for processing radiation comprising:
    a detector including
        an optical substrate for support of an optically sensitive material, and
        an optically sensitive layer for conversion of incoming radiation to electrical charge;
    electronic means for receiving the electrical charge generated by the optically sensitive layer;
    interconnection means for mechanical, electrical and thermal coupling of the electronic means to the detector, such that the radiation detected by the detector is transmitted as electrical signals through the interconnection means to the electronic means;
    cooling means for supporting the electronic means, and for cooling the electronics means and detector; and
    isolation means for separating the electronic means from the cooling means, the isolation means being soft, localized, and sufficiently thick such that the electronic means is cooled by the cooling means without experiencing undesirable distortion, and the interconnection means is unaffected by in-plane and out-of-plane stress.

2. The hybrid focal plane array structure of claim 1, wherein the detector includes a first surface and a second surface, the optically sensitive layer being disposed on the second surface of the detector between the detector and the connection means, and the radiation being received at the first surface of the detector, further wherein the optically sensitive material absorbs the radiation received by the detector, converts the radiation to electrical charge, and transmits the electrical charge through the interconnection means to the electronic means.

3. The hybrid focal plane array of claim 1, wherein the isolation means comprises a soft, thick epoxy.

4. The hybrid focal plane array of claim 3, wherein the epoxy is deposited between the electronic means and the cooling means in a localized area.

5. The hybrid focal plane array of claim 1, wherein the detector comprises a crystalline substrate.

6. The hybrid focal plane array of claim 5, wherein the crystalline substrate is formed of sapphire.

7. The hybrid focal plane array of claim 1, wherein the optically sensitive material comprises mercury-cadmium-telluride and cadmium-telluride compounds.

8. The hybrid focal plane array of claim 1, wherein the interconnection means comprises a pliable conducting material.

9. The hybrid focal plane array of claim 8, wherein the interconnection means comprises a plurality of indium bumps.

10. The hybrid focal plane array of claim 1, wherein the electronic means is represented by conductive network for conducting the electrical charge generated by the optically sensitive layer out of the electronic means.

11. The hybrid focal plane array of claim 1, wherein the electronic means comprises:
    electronic circuitry for processing the electrical charge generated by the optically sensitive layer into electrical signals, and
    a conductive scheme for conducting the electrical signals out of the electronic means.

12. The hybrid focal plane array of claim 1, wherein the cooling means comprises a ceramic material.

13. The FPA of claim 1, further comprising a carrier substrate coupled between the electronic means and the isolation means.

14. The FPA of claim 13, wherein the carrier comprises a multiple-layer substrate.

15. A decoupled focal plane array (FPA) for processing incoming radiation, the FPA comprising:
    a detector having first and second surfaces, the first surface for receiving the incoming radiation;
    an optically sensitive material coupled to the second surface of the detector for absorbing the received radiation, wherein electrical charge representing the radiation impinging on the detector is produced, further wherein the impinging radiation causes heat to be generated within the FPA;

a multiplexer (MUX) substrate coupled to the optically sensitive material, the MUX substrate including electronic circuitry for processing the electrical charge, the MUX substrate having a first surface and a second surface;

interconnection means sandwiched between the optically sensitive material and the first surface of the MUX substrate, the interconnection means for mechanically and electrically coupling the optically sensitive material to the MUX substrate such that the interconnection means transmits the electrical charge through to the MUX substrate;

a cooling means coupled to the interconnection means for supporting and cooling the MUX substrate and the detector to prevent the incoming radiation from overheating the detector and MUX substrate assembly, wherein the generated heat within the FPA applies stress to the detector and MUX substrate assembly; and isolation means for coupling the MUX substrate to the cooling means, the isolation means being soft, localized, and substantially thick such that as the radiation impinges on the detector and as the MUX substrate is cooled by the cooling means distortion of the detector and MUX substrate assembly is reduced, while in-plane and out-of-plane stress on the interconnection means is eliminated.

16. The FPA of claim 15, wherein the isolation means comprises a soft, thick, thermally conductive epoxy.

17. The FPA of claim 16, wherein the epoxy is deposited between the electronic means and the cooling means in a small, localized area about the center of the FPA to reduce the stress on the detector and MUX substrate.

18. The FPA of claim 15, wherein the detector comprises a crystalline substrate.

19. The FPA of claim 15, wherein the optically sensitive material comprises Mercury Cadmium-Telluride and Cadmium-Telluride compounds.

20. The FPA of claim 15, wherein the interconnection means is formed of a pliable conducting material.

21. The FPA of claim 20, wherein the interconnection means comprises a plurality of indium bumps.

22. The FPA of claim 15, wherein the MUX substrate is formed of silicon, and includes electronic circuitry to process the electrical charge transmitted through the interconnection means.

23. The FPA of claim 15, wherein the cooling means comprises a cold plate.

24. A method for supporting and stabilizing a hybrid focal plane array (FPA) provided with an optical substrate for receiving impinging radiation, and a multiplexer (MUX) coupled to the Optical substrate for processing the radiation, the method comprising the steps of:

coupling the multiplexer (MUX) substrate layer to the optically sensitive layer via an interconnection network of pliable, electrically-conducting material; and mounting the MUX substrate to a cooling substrate using a soft, thick, localized epoxy which is thermally conducting and substantially supportive to cool and balance the detector, optically sensitive material, and MUX layers, thereby reducing distortions and deflections.

* * * * *